(12) United States Patent
Zhou

(10) Patent No.: US 9,991,171 B1
(45) Date of Patent: Jun. 5, 2018

(54) SEMICONDUCTOR DEVICE AND INTEGRATED CIRCUIT

(71) Applicant: United Microelectronics Corp., Hsinchu (CN)

(72) Inventor: Zhi-Biao Zhou, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days. days.

(21) Appl. No.: 15/793,822

(22) Filed: Oct. 25, 2017

(51) Int. Cl.
*H01L 21/8234* (2006.01)
*H01L 21/768* (2006.01)
*H01L 21/02* (2006.01)
*H01L 29/51* (2006.01)
*H01L 29/40* (2006.01)
*H01L 29/78* (2006.01)
*H01L 27/088* (2006.01)

(52) U.S. Cl.
CPC ........ *H01L 21/823462* (2013.01); *H01L 21/02172* (2013.01); *H01L 21/76879* (2013.01); *H01L 21/823418* (2013.01); *H01L 27/0886* (2013.01); *H01L 29/401* (2013.01); *H01L 29/516* (2013.01); *H01L 29/7832* (2013.01); *H01L 29/78391* (2014.09)

(58) Field of Classification Search
CPC ....... H01L 21/823462; H01L 29/78391; H01L 21/02172; H01L 21/76879; H01L 21/823418; H01L 27/0886; H01L 29/401; H01L 29/516; H01L 29/7832
See application file for complete search history.

(56) References Cited

U.S. PATENT DOCUMENTS 6,417,086 B1 * 7/2002 Osari .............. H01L 21/32139
257/E21.232
2013/0270552 A1 * 10/2013 Yamazaki .......... H01L 29/7869
257/43
2015/0070962 A1 * 3/2015 Ohmaru .............. G11C 11/403
365/72

FOREIGN PATENT DOCUMENTS

CN 105609562 5/2016

* cited by examiner

*Primary Examiner* — Karen Kusumakar
(74) *Attorney, Agent, or Firm* — J.C. Patents

(57) ABSTRACT

A semiconductor device and an integrated circuit are provided. The semiconductor device includes a field effect transistor, a negative capacitor and a control circuit, which are disposed at different horizontal levels on a substrate. The field effect transistor includes a front gate, a back gate and an oxide semiconductor layer disposed between the front gate and the back gate. The negative capacitor is electrically connected to the back gate of the field effect transistor. The negative capacitor includes a pair of electrodes and a ferroelectric material layer disposed between the pair of electrodes. The negative capacitor is electrically connected between the back gate of the field effect transistor and the control circuit, the control circuit is configured to charge the negative capacitor and to asses a voltage between the pair of electrodes of the negative capacitor.

18 Claims, 3 Drawing Sheets

SEMICONDUCTOR DEVICE AND INTEGRATED CIRCUIT

BACKGROUND OF THE INVENTION

1. Field of the Invention

The present invention generally relates to a semiconductor device and an integrated circuit.

2. Description of Related Art

An oxide semiconductor field effect transistor (OSFET) is referred as a field effect transistor fabricated with an oxide semiconductor material. The OSFET exhibits an ultra low off-state current, as compared with a silicon-based FET. However, in a conventional OSFET, an ultra low off-state current at a sleep/standby mode and a high operation speed at an active mode cannot be both obtained.

SUMMARY OF THE INVENTION

Accordingly, the present invention is directed to a semiconductor device and an integrated circuit having an OSFET with a reduced off-state current at a sleep/standby mode and an improved operation speed at an active mode.

A semiconductor device of some embodiments in the present invention includes a field effect transistor (FET), a negative capacitor and a control circuit. The field effect transistor is disposed on a substrate, wherein the field effect transistor includes: a front gate, a back gate and an oxide semiconductor layer disposed between the front gate and the back gate. The negative capacitor is disposed on the substrate and electrically connected to the back gate of the field effect transistor, wherein the negative capacitor includes a pair of electrodes and a ferroelectric material layer disposed between the pair of electrodes. The control circuit is disposed on the substrate, wherein the negative capacitor is electrically connected between the back gate of the field effect transistor and the control circuit, the control circuit is configured to charge the negative capacitor and to asses a voltage between the pair of electrodes of the negative capacitor. The field effect transistor, the negative capacitor and the control circuit are disposed at different horizontal levels on the substrate.

According to some embodiments, the control circuit is disposed between the substrate and the negative capacitor along a normal direction of the substrate.

According to some embodiments, the control circuit includes at least one CMOS device.

According to some embodiments, the field effect transistor further includes a source electrode and a drain electrode, disposed on the same side of the oxide semiconductor layer and at opposite sides of the front gate.

According to some embodiments, the front gate, the source electrode and the drain electrode are disposed at the same side of the oxide semiconductor layer.

According to some embodiments, the front gate is opposite to the source electrode and the drain electrode across the oxide semiconductor layer.

According to some embodiments, a material of the oxide semiconductor layer includes crystalline indium gallium zinc oxide, amorphous indium gallium zinc oxide or c-axis aligned crystalline indium gallium zinc oxide.

According to some embodiments, a material of the ferroelectric material layer includes hafnium zirconium oxide, barium titanate, lead titanate, lead zirconium titanate, potassium niobate, lithium niobate, lithium tantalite, strontium barium niobate, barium sodium niobate or a combination thereof.

According to some embodiments, the negative capacitor further includes a dielectric layer, disposed between the ferroelectric material layer and at least one of the pair of the electrodes.

According to some embodiments, a material of the dielectric layer includes silicon oxide, silicon nitride, aluminium oxide or a combination thereof.

According to some embodiments, a number of the field effect transistor is plural, and the plurality of field effect transistors have the same threshold voltage.

According to some embodiments, a number of the field effect transistor and a number of the negative capacitor are both plural, the plurality of negative capacitors are electrically connected to different groups of the plurality of field effect transistors respectively, at least one of the groups of the plurality of field effect transistors has a threshold voltage different from a threshold voltage of the plurality of field effect transistors of another one of the groups.

An integrated circuit of some embodiments of the present invention includes a field effect transistor, a negative capacitor and a control circuit. The field effect transistor includes a front gate, a back gate and an oxide semiconductor layer disposed between the front gate and the back gate. The negative capacitor is coupled to the back gate of the field effect transistor. The control circuit is coupled to the negative capacitor, wherein the control circuit is configured to charge the negative capacitor and to asses a voltage of the negative capacitor.

According to some embodiments, the control circuit includes a voltage convertor and a control logic unit. The voltage convertor is coupled to the negative capacitor, and configured to charge the negative capacitor with a charging voltage. The control logic unit is coupled between the negative capacitor and the voltage convertor, and configured to detect the voltage across the negative capacitor and to adjust the charging voltage supplied to the negative capacitor according to a threshold voltage of the field effect transistor and the detected voltage of the negative capacitor.

According to some embodiments, he control circuit further includes a power management circuit, coupled to the voltage convertor and the control logic unit, and configured to supply power to the voltage convertor and the control logic unit.

As above, the control circuit is configured to charge the negative capacitor and to assess a voltage across the negative capacitor. Accordingly, a dynamically varied back gate bias can be supplied to the FET by the negative capacitor. As such, a balance of increasing an operation speed at an active mode of the FET and reducing an off-state current at a sleep mode or a standby mode of the FET can be attained. Furthermore, the negative capacitor can exhibit a ferroelectricity, and have a negative capacitance. Thus, the negative capacitor can hold the back gate bias after being programmed, and can compensate a parasite capacitance in the semiconductor device or the integrated circuit. Therefore, a power consumption of the semiconductor device or the integrated circuit can be lowered. In addition, an integration of the control circuit, the FET and the negative capacitor is achieved. The control circuit, the FET and the negative capacitor are disposed at different horizontal levels. Thus, the interference between the control circuit, the FET and the negative capacitor can be reduced during operation. Similarly, the influence on the upper one(s) of the control circuit, the FET and the negative capacitor by the manufacturing process of the lower one(s) of the control circuit, the FET and the negative capacitor can be avoided. Therefore, a manufacturing process control of the semiconductor device or the integrated circuit can be improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
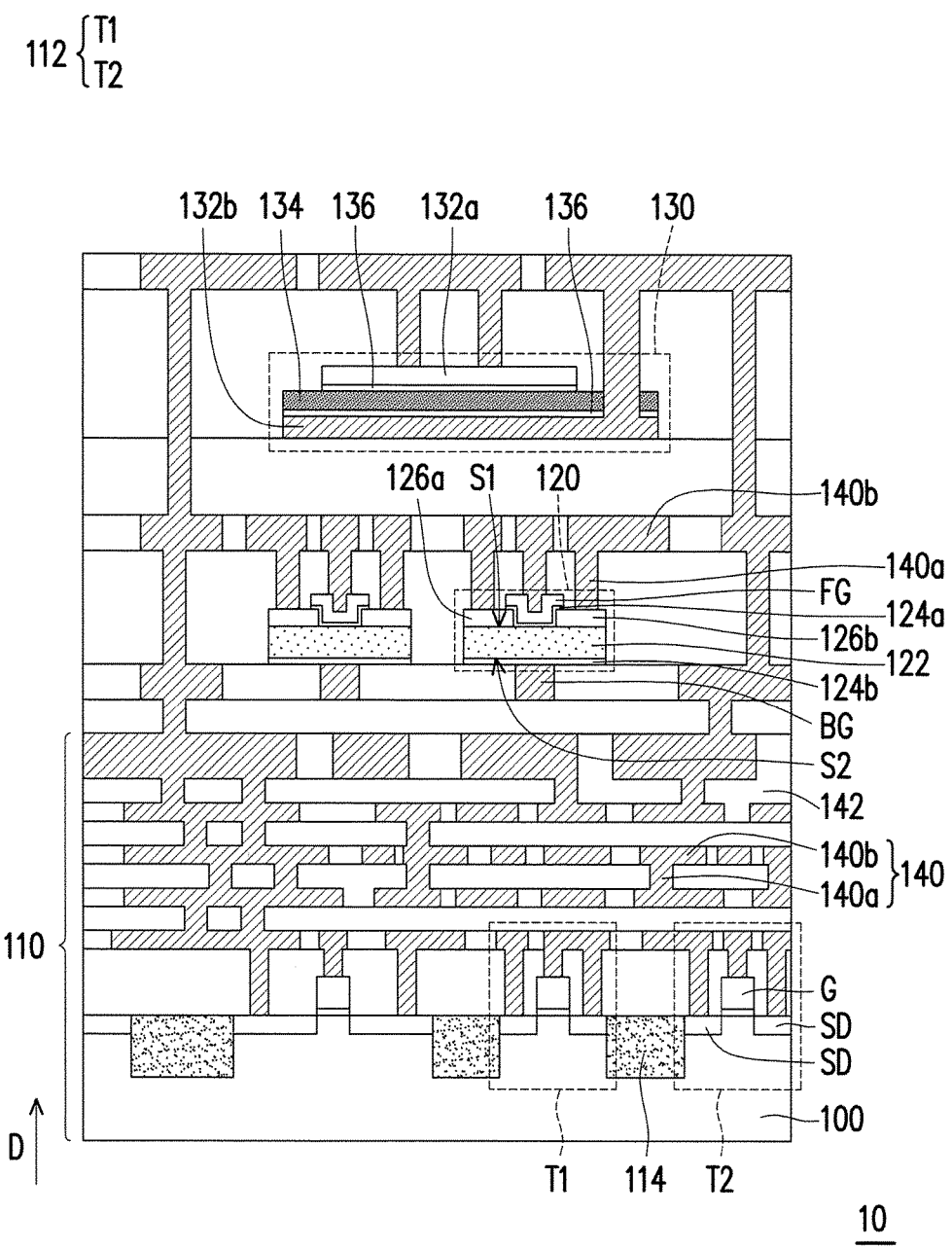
FIG. 1 is a cross-sectional view illustrating a semiconductor device according to some embodiments of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a cross-sectional view illustrating a semiconductor device 10 according to some embodiments of the present invention.

Referring to FIG. 1, the semiconductor device 10 includes a control circuit 110, a field effect transistor (FET) 120 and a negative capacitor 130. The negative capacitor 130 is electrically connected to a back gate BG of the FET 120, so as to provide a back gate bias to the FET 120. The control circuit 110 is electrically connected to the negative capacitor 130, such that the negative capacitor 130 is electrically connected between the back gate BG of the FET 120 and the control circuit 110. The control circuit 110 is configured to charge the negative capacitor 130 and to assess a voltage across a pair of electrodes (electrode 132a and electrode 132b) of the negative capacitor 130. Accordingly, a threshold voltage of the FET 120 can be dynamically adjusted by the negative capacitor 130 and the control circuit 110.

The control circuit 110 is disposed on a substrate 100. In some embodiments, the substrate 100 is a semiconductor substrate or a semiconductor-on-insulator (SOI) substrate. A semiconductor material of the semiconductor substrate or the SOI substrate may include an elemental semiconductor or a compound semiconductor. For instance, the elemental semiconductor may include Si or Ge. The compound semiconductor may include SiGe, SiC, SiGeC, a III-V semiconductor or a II-VI semiconductor. For instance, the III-V semiconductor includes GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs or InAlPAs. The II-VI semiconductor may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe or HgZnSTe. The semiconductor material may be doped with an n-type dopant or a p-type dopant, or may be an intrinsic semiconductor material. In alternative embodiments, the substrate 100 is an insulating substrate. For instance, a material of the insulating substrate includes aluminum oxide, aluminum nitride, boron nitride, silicon oxide, silicon nitride or beryllium nitride.

The control circuit 110 includes a plurality of active devices. The active devices include at least one complementary metal-oxide-semiconductor (CMOS) device 112. The CMOS device 112 includes at least one n-type metal-oxide-semiconductor (MOS) transistor T1 and a p-type MOS transistor T2 electrically connected with the n-type MOS transistor T1. The n-type MOS transistor T1 and the p-type MOS transistor T2 are separated from each other by an isolation structure 114. In some embodiments, the isolation structure 114 (as shown in FIG. 1) is formed in the substrate 100, and is also referred as a shallow trench isolation (STI) structure. In alternative embodiments, the isolation structure may be formed on the substrate, and is also referred as a field oxide or a local oxidation of silicon (LOCOS) structure. The n-type MOS transistor T1 and the p-type MOS transistor T2 respectively include a gate electrode G and a pair of source/drain regions SD disposed at opposite sides of the gate electrode G. For the n-type MOS transistor T14, a p-type well (not shown) may be formed in the substrate 100 and between the pair of the source/drain regions SD. Similarly, for the p-type MOS transistor T2, an n-type well (not shown) may be formed in the substrate 100 and between the pair of the source/drain regions SD. In addition to the CMOS device 112, the active devices may further include a diode, a bipolar junction transistor or a combination thereof, which are not shown in FIG. 1. In some embodiments, the control circuit 110 may further include at least one passive device (not shown) electrically connected to the active devices. For instance, the passive device may include a resistor, a capacitor, an inductor or a combination thereof.

An interconnection structure 140 is electrically connected between the active devices of the control circuit 110, and is electrically connected to the back gate BG of the FET 120. The interconnection structure 140 includes conductive vias 140a and conductive traces 140b. At least one inter-layer dielectric (ILD) layer 142 is disposed on the substrate 100. In some embodiments, a plurality of the ILD layers 142 and the conductive traces 140b are alternately stacked on the substrate 100. The conductive vias 140a penetrate through the ILD layers 142 to electrically connect the conductive traces 140b at different horizontal levels. The bottommost conductive via 140a may also be known as a conductive plug. In some embodiments, a material of the contact plug (i.e., the bottommost conductive via 140a) may include tungsten. A material of the conductive vias 140a and the conductive traces 140b above the contact plug may include copper, aluminium or the like.

The FET 120 is disposed on the substrate 100. In some embodiments, the FET 120 may be disposed on the control circuit 110. In other words, the control circuit 110 may be disposed between the substrate 100 and the FET 120 along a normal direction D of the substrate 100. The FET 120 may be an oxide semiconductor field effect transistor (OSFET). The FET 120 includes a front gate FG, a back gate BG and an oxide semiconductor layer 122 disposed between the front gate FG and the back gate BG. In some embodiments, materials of the front gate FG and the back gate BG respectively include polysilicon, Mo, Pt, Al, Ti, Co, Au, Cu, TiN, TaN or a combination thereof. A material of the oxide semiconductor layer 122 may include indium oxide, tin oxide, zinc oxide, a two-component metal oxide (such as In—Zn-based oxide, Sn—Zn-based oxide, Al—Zn-based oxide, Zn—Mg-based oxide, Sn—Mg-based oxide, In—Mg-based oxide or In—Ga-based oxide), a three-component metal oxide (such as In—Ga—Zn-based oxide (also referred to as indium gallium zinc oxide (IGZO)), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide or In—Lu—Zn-based oxide), or four-component metal oxide (such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide or In—Hf—Al—Zn-based oxide). In some embodiments, the material oxide semiconductor layer 122 is IGZO. Regarding a crystallinity of IGZO, the IGZO may be amorphous, crystalline or c-axis aligned crystalline (CAAC).

The FET 120 may further include a front gate dielectric layer 124a and a back gate dielectric layer 124b. The front gate dielectric layer 124a is disposed between the front gate FG and the oxide semiconductor layer 122, and the back gate dielectric layer 124b is disposed between the back gate BG and the oxide semiconductor layer 122. Materials of the front gate dielectric layer 124a and the back gate dielectric layer 124b may respectively include silicon oxide, silicon nitride, a high-k dielectric material (of which a dielectric constant is greater than 4) or a combination thereof. The FET 120 may further include a source electrode 126a and a drain electrode 126b. The source electrode 126a and the drain electrode 126b are disposed on the same side of the oxide semiconductor layer 122, and are disposed at opposite sides of the front gate FG. In addition, the front gate dielectric layer 124a may further be located between the front gate FG and the source electrode 126a, and between the front gate FG and the drain electrode 126b. As such, the front gate dielectric layer 124a may cover a sidewall and a portion of a top surface of the source electrode 126a. Similarly, the front gate dielectric layer 124a may cover a sidewall and a portion of a top surface of the drain electrode 126b. In some embodiments, the front gate FG, the source electrode 126a and the drain electrode 126b are disposed at the first side S1 of the oxide semiconductor layer 122, whereas the back gate BG is disposed at a second side S2 of the oxide semiconductor layer 122. The first side S1 is opposite to the second side S2. In some embodiments, materials of the source electrode 126a and the drain electrode 126b may respectively include polysilicon, Mo, Pt, Al, Ti, Co, Au, Cu, TiN, TaN or a combination thereof.

The negative capacitor 130 is disposed on the substrate 100. In some embodiments, the negative capacitor 130 is disposed on the FET 120, such that the FET 120 is disposed between the control circuit 110 and the negative capacitor 130 along a normal direction D of the substrate 100. In alternative embodiments, the FET 120 may be disposed on the negative capacitor 130, such that the negative capacitor 130 is disposed between the control circuit 110 and the FET 120 along the normal direction D of the substrate 100. The negative capacitor 130 includes a pair of electrodes (an electrode 132a and an electrode 132b) and a ferroelectric material layer 134 disposed between the electrode 132a and the electrode 132b. In some embodiments, materials of the electrode 132a and the electrode 132b may respectively include . . . . In some embodiments, a ferroelectric material of the ferroelectric material layer 134 includes hafnium zirconium oxide, barium titanate, lead titanate, lead zirconium titanate, potassium niobate, lithium niobate, lithium tantalite, strontium barium niobate, barium sodium niobate or a combination thereof. In some embodiments, the negative capacitor 130 may further include a dielectric layer 136 disposed between the ferroelectric material layer 134 and at least one of the electrode 132a and the electrode 132b. For instance, a material of the dielectric layer 136 may include silicon oxide, silicon nitride, aluminium oxide or a combination thereof. The dielectric layer 136 is disposed to improve an isolation between the oxide semiconductor layer 134 and at least one of the electrode 132a and the electrode 132b. However, in alternative embodiments, the negative capacitor 130 may not include the dielectric layer 136. In other words, the oxide semiconductor layer 134 may be in direct contact with the electrode 132a and/or the electrode 132b.

The negative capacitor 130 is serially connected to the back gate BG of the FET 120 through the interconnection structure 140, so as to provide a back gate bias to the FET 120. Accordingly, the threshold voltage of the FET 120 can be lowered or increased when a positive back gate bias or a negative back gate bias is provided to the FET 120. When the threshold voltage of the FET 120 is lowered, an operation speed of the FET can be raised. On the other hand, when the threshold voltage of the FET 120 is increased, an off-state current of the FET 120 can be reduced. Since the ferroelectric material layer 134 is applied in the negative capacitor 130, the negative capacitor 130 can exhibit a ferroelectricity, and can have a negative capacitance. Therefore, the negative capacitor 130 can hold the back gate bias after being programmed. In addition, the negative capacitor 130 can compensate a parasite capacitance in the semiconductor device 10. As a result, a power consumption of the semiconductor device 10 can be lowered.

The control circuit 110, the FET 120 and the negative capacitor 130 are spaced apart by the ILD layers 142. In other words, the control circuit 110, the FET 120 and the negative capacitor 130 are disposed at different horizontal levels on the substrate 100. As such, an interference between the control circuit 110, the FET 120 and the negative capacitor 130 can be reduced during operation of the semiconductor device 10. In addition, an influence on components at a higher horizontal level (such as the FET 120 and the negative capacitor 130) of the semiconductor device 10 by a manufacturing process of components at a lower horizontal level (such as the control circuit 110) of the semiconductor device 10 can be avoided. Therefore, a manufacturing process control of the semiconductor device 10 can be improved.

The control circuit 110, the FET 120 and the negative capacitor 130 are electrically connected via the interconnection structure 140. The interconnection structure 140 is electrically connected between the control circuit 110 and the back gate BG of the FET 120. In addition, the interconnection structure 140 is electrically connected between the back gate BG and the electrode 132a (or the electrode 132b) of the negative capacitor 130. In other words, the electrode 132a (or the electrode 132b) is electrically connected between the control circuit 110 and the back gate BG of the FET 120.

In some embodiments, one negative capacitor 130 is electrically connected to one FET 120. In other embodiments, one negative capacitor 130 can be electrically connected to a plurality of the FETs 120, and the FETs 120 have the same threshold voltage. In yet other embodiments, a plurality of the negative capacitor 130 can be electrically connected to different groups of a plurality of the FETs 120. At least one of the groups of the FETs 120 has a threshold voltage different from a threshold voltage of the FETs 120 of another one of the groups.

As above, the control circuit 110, the FET 120 and the negative capacitor 130 are integrated in the semiconductor device 10. The negative capacitor 130 is electrically connected between the back gate BG of the FET 120 and the control circuit 110. The control circuit 110 is configured to charge the negative capacitor 130 and to assess a voltage across the negative capacitor 130. Accordingly, a threshold voltage of the FET 120 can be dynamically adjusted by the negative capacitor 130 and the control circuit 110. The control circuit 110, the FET 120 and the negative capacitor 130 are disposed at different horizontal levels on the substrate 100. Thus, the interference between the control circuit 110, the FET 120 and the negative capacitor 130 can be reduced during operation of the semiconductor device 10. In addition, the influence on the upper one(s) of the control circuit 110, the FET 120 and the negative capacitor 130 by the manufacturing process of the lower one(s) of the control circuit 110, the FET 120 and the negative capacitor 130 can be avoided. Therefore, manufacturing process control of the semiconductor device 10 can be improved. Furthermore, the negative capacitor 130 can exhibit a ferroelectricity, and have a negative capacitance. Thus, the negative capacitor 130 can hold the back gate bias after being programmed, and can compensate a parasite capacitance in the semiconductor device 10. Therefore, a power consumption of the semiconductor device 10 can be lowered.

Figure 2:
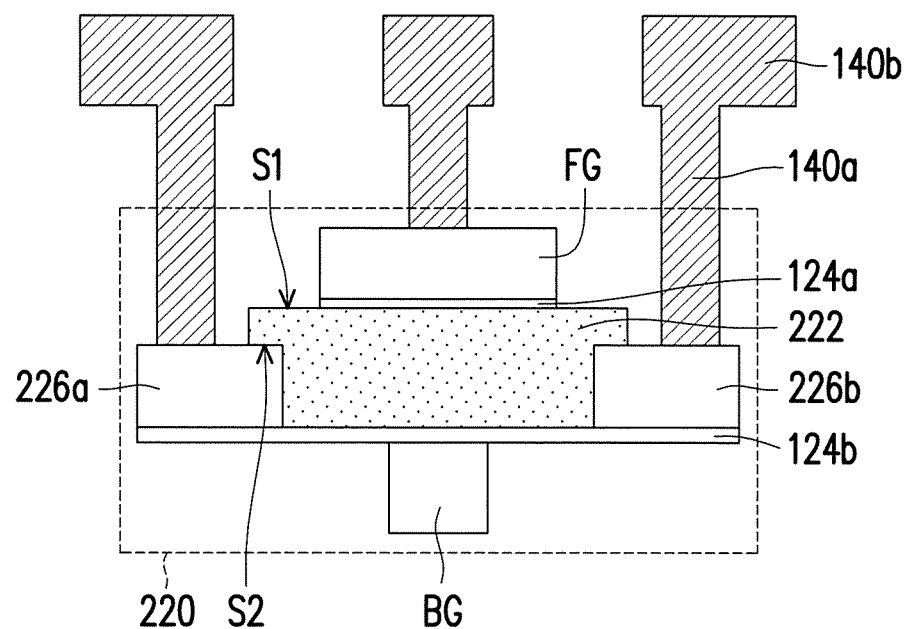
FIG. 2 is an enlarged cross-sectional view illustrating a field effect transistor according to alternative embodiments of the present invention.

FIG. 2 is an enlarged cross-sectional view illustrating a field effect transistor 220 according to alternative embodiments of the present invention.

Referring FIG. 1 and FIG. 2, a semiconductor device in the present embodiment is similar to the semiconductor device 10 as shown in FIG. 1, except that a FET 220 of the semiconductor device in the present embodiment is different from the FET 120 as shown in FIG. 1. In the FET 220, the front gate FG is opposite to the source electrode 226a and the drain electrode 226b across the oxide semiconductor layer 222. In some embodiments, the front gate FG is disposed at the first side S1 of the oxide semiconductor layer 222, whereas the source electrode 226a and the drain electrode 226b are disposed at the second side S2 of the oxide semiconductor layer 222. As such, at least a portion of the second side S2 of the oxide semiconductor layer 222 covers top surfaces of the source electrode 226a and the drain electrode 226b.

Figure 3:
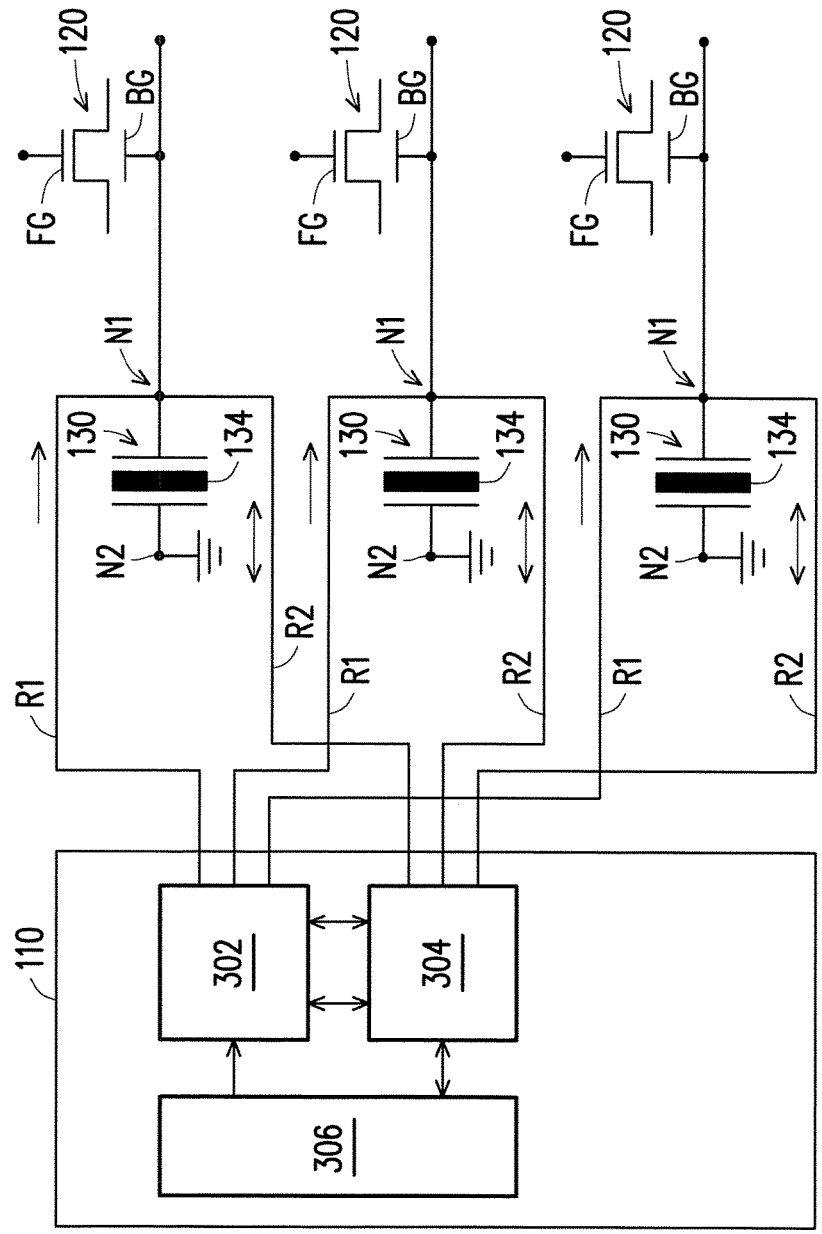
FIG. 3 is a circuit diagram illustrating an integrated circuit according to some embodiments of the present invention.

FIG. 3 is a circuit diagram illustrating an integrated circuit 300 according to some embodiments of the present invention. Structures of the components in the integrated circuit 300 including the control circuit 110, the FET 120 and the negative capacitor 130 are shown in FIG. 1, and would not be illustrated again. On the other hand, the integrated circuit 300 presented in FIG. 3 shows how the components in the semiconductor 10 as shown in FIG. 1 are interconnected. In addition, the FET 120 illustrated therein may be replaced by the FET 220 as shown in FIG. 2.

Referring to FIG. 1 and FIG. 3, the integrated circuit 300 includes the control circuit 110, the FET 120 and the negative capacitor 130. The negative capacitor 130 is coupled to the back gate BG of the FET 120. The control circuit 110 is coupled to the negative capacitor 130. In some embodiment, the control circuit 110 and the back gate BG of the FET 120 may be couple to the same terminal N1 of the negative capacitor 130. Another terminal N2 of the negative capacitor 130 may be grounded.

In some embodiments, the control circuit 110 may include a voltage convertor 302 and a control logic unit 304. In the present embodiment, the control logic unit 304 may be, for example, a central processing unit (CPU), or other programmable devices for general purpose or special purpose, such as a microprocessor and a digital signal processor (DSP), a programmable controller, an application specific integrated circuit (ASIC), a programmable logic device (PLD) or other similar devices or a combination of above-mentioned devices. The voltage convertor 302 is coupled to the negative capacitor 130 through a route R1, and is configured to charge the negative capacitor 130 with a charging voltage. The control logic unit 304 is coupled to the terminal N1 of the negative capacitor 130 through a route R2, and is configured to assess a voltage across the terminal N1 and the terminal N2 of the negative capacitor 130. The control logic unit 304 is also coupled to the voltage convertor 302, so that the control logic unit 304 is coupled between the negative capacitor 130 and the voltage convertor 302. As such, the control logic unit 304 is also configured to adjust the charging voltage supplied to the negative capacitor 130 according to a threshold voltage of the FET 120 and the voltage across the terminal N1 and the terminal N2 of the negative capacitor 130. In other words, the charging voltage supplied to the negative capacitor 130 can be varied dynamically.

In some embodiments, the charging voltage supplied to the negative capacitor 130 may be adjusted further according to an operation mode of the FET 120. In an active mode of the FET 120, the negative capacitor 130 is programmed to supply a positive back gate bias to the back gate BG of the FET 120, so as to lower the threshold voltage of the FET 120. As such, an operation speed of the FET 120 in the active mode can be improved. On the other hand, in a sleep mode or a standby mode of the FET 120, the negative capacitor 130 is programmed to supply a positive back gate bias to the back gate BG of the FET 120, so as to increase the threshold voltage of the FET 120. As such, an off-state current of the FET 120 in the sleep mode can be reduced, such that a longer data retention during the sleep mode or the standby mode can be attained.

In some embodiments, the control circuit 110 may further include a power management circuit 306. The power management circuit 306 is coupled to the voltage convertor 302 and the control logic unit 304. The power management circuit 306 is configured to supply power to the voltage convertor 302 and the control logic unit 304. In some embodiments, the power management circuit 306 can be programmed with a plurality of working modes, so as to manage the operation of charging the negative capacitor 130 by the voltage convertor 302 and the operation of assessing the voltage of the negative capacitor 130 by the control logic unit 304. As such, an order of the above-mentioned operations and a value of the charging voltage supplied to the negative capacitor 130 can be determined by the control circuit 110.

Embodiments of one negative capacitor 130 being coupled between the control circuit 110 and one FET 120 have been discussed above. However, in some embodiments, as shown in FIG. 3, a number of the negative capacitor 130 is plural, and a number of the FET 120 is plural as well. Each one of the negative capacitors 130 is coupled between one FET 120 and the control circuit 110. At least one of the FETs 120 has a threshold voltage different from the others of the FETs 120. In other embodiments, the negative capacitors 130 are respectively coupled between different groups of the FETs 120 and the control circuit 110, and at least one of the groups of the FETs 120 has a threshold voltage different from a threshold voltage of the FETs 120 from another one of the groups. In other words, one negative capacitor 130 can be coupled to one FET 120, or be coupled to a group of FETs 120. Thus, the control circuit 110 is configured to manage the back gate bias supplied to one or more FETs 120 through one or more negative capacitors 130.

As above, the back gate bias supplied to the FET 120 via the negative capacitor 130 can be dynamically adjusted by the control circuit 110. In some embodiments, the back gate bias can be adjusted according to factors including a threshold voltage of the FET 120, a voltage across the negative capacitor 130 and an operation mode of the FET 120. Therefore, one FET 120 or a plurality of FETs 120 having different threshold voltages can be supplied with the same back gate bias or different back gate biases. In addition, a balance of increasing an operation speed at an active mode of the FET 120 and reducing an off-state current at a sleep mode or a standby mode of the FET 120 can be achieved. Furthermore, the negative capacitor 130 can exhibit a ferroelectricity, and have a negative capacitance. Thus, the negative capacitor 130 can hold the back gate bias after being programmed, and can compensate a parasite capacitance in the semiconductor device 10. Therefore, a power consumption of the semiconductor device 10 can be lowered.

To sum up, the control circuit is configured to charge the negative capacitor and to assess a voltage across the negative capacitor. Accordingly, a dynamically varied back gate bias can be supplied to the FET by the negative capacitor. As such, a balance of increasing an operation speed at an active mode of the FET and reducing an off-state current at a sleep mode or a standby mode of the FET can be attained. Furthermore, the negative capacitor can exhibit a ferroelectricity, and have a negative capacitance. Thus, the negative capacitor can hold the back gate bias after being programmed, and can compensate a parasite capacitance in the semiconductor device or the integrated circuit. Therefore, a power consumption of the semiconductor device or the integrated circuit can be lowered. In addition, an integration of the control circuit, the FET and the negative capacitor is achieved. The control circuit, the FET and the negative capacitor are disposed at different horizontal levels. Thus, the interference between the control circuit, the FET and the negative capacitor can be reduced during operation. Similarly, the influence on the upper one(s) of the control circuit, the FET and the negative capacitor by the manufacturing process of the lower one(s) of the control circuit, the FET and the negative capacitor can be avoided. Therefore, a manufacturing process control of the semiconductor device or the integrated circuit can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A semiconductor device, comprising:
a field effect transistor, disposed on a substrate, wherein the field effect transistor comprises: a front gate, a back gate and an oxide semiconductor layer disposed between the front gate and the back gate;
a negative capacitor, disposed on the substrate and electrically connected to the back gate of the field effect transistor, wherein the negative capacitor comprises a pair of electrodes and a ferroelectric material layer disposed between the pair of electrodes;
a control circuit, disposed on the substrate, wherein the negative capacitor is electrically connected between the back gate of the field effect transistor and the control circuit, the control circuit is configured to charge the negative capacitor and to asses a voltage between the pair of electrodes of the negative capacitor,
wherein the field effect transistor, the negative capacitor and the control circuit are disposed at different horizontal levels on the substrate.

2. The semiconductor device according to claim 1, wherein the control circuit is disposed between the substrate and the negative capacitor along a normal direction of the substrate.

3. The semiconductor device according to claim 1, wherein the control circuit comprises at least one CMOS device.

4. The semiconductor device according to claim 1, wherein the field effect transistor further comprises a source electrode and a drain electrode, disposed on the same side of the oxide semiconductor layer and at opposite sides of the front gate.

5. The semiconductor device according to claim 4, wherein the front gate, the source electrode and the drain electrode are disposed at the same side of the oxide semiconductor layer.

6. The semiconductor device according to claim 4, wherein the front gate is opposite to the source electrode and the drain electrode across the oxide semiconductor layer.

7. The semiconductor device according to claim 1, wherein a material of the oxide semiconductor layer comprises crystalline indium gallium zinc oxide, amorphous indium gallium zinc oxide or c-axis aligned crystalline indium gallium zinc oxide.

8. The semiconductor device according to claim 1, wherein a material of the ferroelectric material layer comprises hafnium zirconium oxide, barium titanate, lead titanate, lead zirconium titanate, potassium niobate, lithium niobate, lithium tantalite, strontium barium niobate, barium sodium niobate or a combination thereof.

9. The semiconductor device according to claim 1, wherein the negative capacitor further comprises a dielectric layer, disposed between the ferroelectric material layer and at least one of the pair of the electrodes.

10. The semiconductor device according to claim 8, wherein a material of the dielectric layer comprises silicon oxide, silicon nitride, aluminium oxide or a combination thereof.

11. The semiconductor device according to claim 1, wherein a number of the field effect transistor is plural, and the plurality of field effect transistors have the same threshold voltage.

12. The semiconductor device according to claim 1, wherein a number of the field effect transistor and a number of the negative capacitor are both plural, the plurality of negative capacitors are electrically connected to different groups of the plurality of field effect transistors respectively, at least one of the groups of the plurality of field effect transistors has a threshold voltage different from a threshold voltage of the plurality of field effect transistors of another one of the groups.

13. An integrated circuit, comprising:
a field effect transistor, comprising a front gate, a back gate and an oxide semiconductor layer disposed between the front gate and the back gate;
a negative capacitor, coupled to the back gate of the field effect transistor; and
a control circuit, coupled to the negative capacitor, wherein the control circuit is configured to charge the negative capacitor and to asses a voltage of the negative capacitor.

14. The integrated circuit according to claim 13, wherein the control circuit and the back gate of the field effect transistor are coupled to the same terminal of the negative capacitor.

15. The integrated circuit according to claim 13, wherein the control circuit comprises:
a voltage convertor, coupled to the negative capacitor, and configured to charge the negative capacitor with a charging voltage; and
a control logic unit, coupled between the negative capacitor and the voltage convertor, and configured to detect the voltage across the negative capacitor and to adjust the charging voltage supplied to the negative capacitor according to a threshold voltage of the field effect transistor and the detected voltage of the negative capacitor.

16. The integrated circuit according to claim 15, wherein the control circuit further comprises a power management circuit, coupled to the voltage convertor and the control logic unit, and configured to supply power to the voltage convertor and the control logic unit.

17. The integrated circuit according to claim 13, wherein a number of the field effect transistor is plural, and the plurality of field effect transistors have the same threshold voltage.

18. The integrated circuit according to claim 13, wherein a number of the field effect transistor and a number of the negative capacitor are both plural, the plurality of negative capacitors are respectively coupled to different groups of the plurality of field effect transistors, at least one of the groups of the plurality of field effect transistors has a threshold voltage different from a threshold voltage of the plurality of field effect transistors of another one of the groups.

* * * * *